(12) United States Patent
Quemerais et al.

(10) Patent No.: US 9,929,720 B2
(45) Date of Patent: Mar. 27, 2018

(54) HIGH FREQUENCY ATTENUATOR

(71) Applicants: STMicroelectronics SA, Montrouge (FR); STMicroelectronics (Crolles 2) SAS, Crolles (FR)

(72) Inventors: Thomas Quemerais, Chirens (FR); Alice Bossuet, Grenoble (FR); Daniel Gloria, Detrier (FR)

(73) Assignees: STMICROELECTRONICS (CROLLES 2) SAS, Crolles (FR); STMICROELECTRONICS SA, Montrouge (FR)

( * ) Notice: Subject to any disclaimer, the term of this patent is extended or adjusted under 35 U.S.C. 154(b) by 49 days.

(21) Appl. No.: 14/847,900

(22) Filed: Sep. 8, 2015

(65) Prior Publication Data

US 2016/0164493 A1 Jun. 9, 2016

(30) Foreign Application Priority Data

Dec. 9, 2014 (FR) ...................................... 14 62091

(51) Int. Cl.
*G01R 1/067* (2006.01)
*H03H 11/24* (2006.01)
*H03F 3/60* (2006.01)

(52) U.S. Cl.
CPC ....... *H03H 11/245* (2013.01); *G01R 1/06711* (2013.01); *H03F 3/602* (2013.01); *H03F 2200/211* (2013.01)

(58) Field of Classification Search
CPC ................. H03H 11/245; G01R 1/06–1/07392
USPC ...................... 324/755.01, 616; 327/308–309
See application file for complete search history.

(56) References Cited

U.S. PATENT DOCUMENTS

| 3,663,900 A * | 5/1972 | Peterson ................ H03H 7/255 327/308 |
| 3,875,522 A | 4/1975 | Hoefi |
| 4,395,643 A | 7/1983 | Lehmann |
| 4,496,860 A * | 1/1985 | Tokumo ............... H03G 1/0023 327/308 |
| 4,625,131 A * | 11/1986 | Kasperkovitz ......... H03H 11/54 327/100 |

(Continued)

FOREIGN PATENT DOCUMENTS

GB 2489814 A 10/2012

OTHER PUBLICATIONS

Bae et al., "A 10-67-GHz CMOS Step Attenuator with Improved Flatness and Large Attenuation Range," IEEE 13th Topical Meeting on Silicon Monolithic Integrated Circuits (SiRF), Austin, TX, Jan. 21-23, 2013, 3 pages.

(Continued)

*Primary Examiner* — Patrick Assouad
*Assistant Examiner* — Demetrius Pretlow
(74) *Attorney, Agent, or Firm* — Seed IP Law Group LLP

(57) ABSTRACT

An attenuator includes: a first circuit including a common collector or common drain amplifier formed of a first transistor having its control node connected to an input of the attenuator and its emitter or source connected to an intermediate node of the attenuator; and a second circuit including a common collector or common drain amplifier formed of a second transistor having its emitter or source connected to the intermediate node and its control node connected to an output of the attenuator.

22 Claims, 1 Drawing Sheet

(56) References Cited

U.S. PATENT DOCUMENTS

| | | | | |
|---|---|---|---|---|
| 5,191,303 A * | 3/1993 | Porter | ............... | H03H 7/24 |
| | | | | 323/370 |
| 5,218,293 A * | 6/1993 | Kan | ............ | G01R 1/06772 |
| | | | | 324/754.14 |
| 5,568,092 A * | 10/1996 | Shimizu | ............. | H03F 1/34 |
| | | | | 330/260 |
| 5,757,220 A * | 5/1998 | Murden | ........... | H03H 11/24 |
| | | | | 327/306 |
| 2004/0008082 A1 | 1/2004 | Dow | | |
| 2010/0007421 A1 * | 1/2010 | Vice | ............. | H03H 11/245 |
| | | | | 330/284 |
| 2010/0295594 A1 * | 11/2010 | Teo | ............. | H03F 3/45179 |
| | | | | 327/308 |
| 2012/0135698 A1 * | 5/2012 | Yan | ............. | H03H 7/24 |
| | | | | 455/127.5 |
| 2013/0099797 A1 | 4/2013 | Quemerais et al. | | |

OTHER PUBLICATIONS

Kushima et al., "Linear and Compact Floating Node Voltage-Controlled Variable Resistor Circuit," *IEICE Trans. Fundamentals E89-A*(2):459-460, Feb. 2006.

* cited by examiner

HIGH FREQUENCY ATTENUATOR

This application claims the priority benefit of FR Patent application number 14/62091, filed on Dec. 9, 2014, the contents of which is hereby incorporated by reference in its entirety to the maximum extent allowable by law.

BACKGROUND

Technical Field

The present disclosure relates to the field of high frequency attenuators, and also to the field of high frequency attenuators with variable attenuation for device testing.

Description of the Related Art

In certain applications, it may be desirable to provide an attenuator capable of attenuating high frequency signals, for example having a frequency higher than 120 GHz, and up to 175 GHz or more.

For example, in the field of high frequency device characterization, a device under test may be driven with a high frequency input signal, and one or more output signals of the device under test are detected using a probe in order to determine characteristics of the device. In order to be able to accurately detect an output signal over a relatively broad voltage range, one or more attenuators are for example provided for reducing the voltage level of the output signal.

There is however a difficulty in providing an attenuator capable of providing a relatively low level of attenuation, for example as low as −6 dB.

Furthermore, there is a difficulty in providing an attenuator having a variable attenuation and/or that can operate over a relatively broad bandwidth, for example of 20 GHz or more.

BRIEF SUMMARY

According to one aspect, there is provided an attenuator comprising: a first circuit including a common collector or common drain amplifier formed of a first transistor having its control node connected to an input of the attenuator and its emitter or source connected to an intermediate node of the attenuator; and a second circuit including a common collector or common drain amplifier formed of a second transistor having its emitter or source connected to the intermediate node and its control node connected to an output of the attenuator.

According to an embodiment, the emitter or source of the first transistor is further connected to a first variable current source and the emitter or source of the second transistor is further connected to a second variable current source.

According to an embodiment, the first variable current source is a third transistor receiving at its control node a biasing voltage and the second variable current source is a fourth transistor receiving at its control node the biasing voltage.

According to an embodiment, the attenuator further comprises a control circuit for generating the biasing voltage based on a control signal.

According to an embodiment, the control node of the first transistor is coupled to the input of the attenuator via the series connection of a first capacitor and a first waveguide, and the control node of the second transistor is coupled to the output node of the attenuator via the series connection of a second capacitor and a second waveguide.

According to an embodiment, the emitter or source of the first transistor is coupled to the intermediate node via the series connection of a third capacitor and a third waveguide and the emitter or source of the second transistor is coupled to the intermediate node via the series connection of a fourth capacitor and a fourth waveguide.

According to a further aspect, there is provided a probe comprising: an integrated circuit comprising the above attenuator connected to at least one input pin suitable for connecting an output pad of a device under test to the integrated circuit.

According to an embodiment, the integrated circuit comprises a matching network connecting the attenuator to the at least one input pin.

According to an embodiment, the integrated circuit further comprises: a first power detector, the attenuator and first power detector being both connected to the at least one input pin via a splitter; and a second power detector connected to the output of the attenuator.

BRIEF DESCRIPTION OF THE SEVERAL VIEWS OF THE DRAWINGS

The foregoing and other features and advantages will become apparent from the following detailed description of embodiments, given by way of illustration and not limitation with reference to the accompanying drawings, in which.

DETAILED DESCRIPTION

In the following description, an attenuator is described in relation to the particular application of device characterization. Such an attenuator can however be used in any of a broad range of applications where the attenuation of high frequency signals is desired. For example, possible alternative applications include wireless receivers, or variable gain amplifiers in wireless transmitters.

The term "approximately" as used herein implies a tolerance of plus or minus 10 percent of the value in question.

Figure 1:
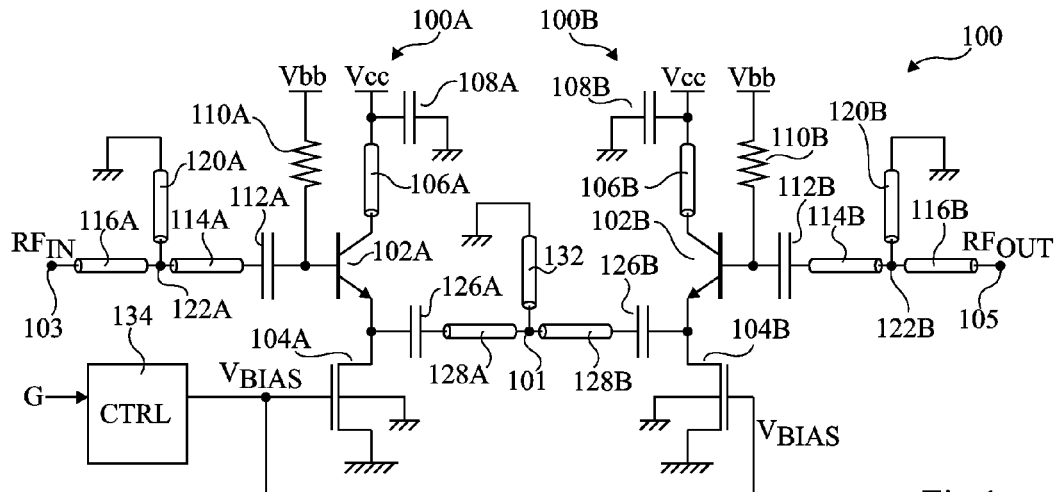
FIG. 1 schematically illustrates an attenuator according to an embodiment of the present disclosure.

FIG. 1 illustrates an attenuator 100, which is for example implemented on an integrated circuit, in other words as an "on-chip" solution.

The attenuator 100 comprises a circuit portion 100A on the left-hand side having elements referenced with the suffix "A", and a circuit portion 100B on the right-hand side having elements referenced with the suffix "B". It will be noted that the circuit portions 100A, 100B are broadly symmetrical with each other around an intermediate node 101 of the attenuator.

The circuit 100A comprises a common-collector amplifier formed of an npn bipolar transistor 102A having its base coupled to an input 103 of the attenuator. This input 103 receives an input signal $RF_{IN}$. The emitter of the bipolar transistor 102A is connected to a variable current source 104A. In the example of FIG. 1, the variable current source 104A is implemented by a MOS transistor having its source connected to ground and receiving, at its gate, a control voltage $V_{BIAS}$. The emitter of the bipolar transistor 102A is also coupled to the intermediate node 101 of the attenuator.

Similarly, the circuit 100B comprises a common-collector amplifier formed of an npn bipolar transistor 102B having its base coupled to an output 105 of the attenuator. This output 105 provides an output signal $RF_{OUT}$. The emitter of the bipolar transistor 102B is connected to a variable current source 104B. In the example of FIG. 1, the variable current source 104B is implemented by a MOS transistor having its source connected to ground and receiving, at its gate, the control voltage $V_{BIAS}$. The emitter of the bipolar transistor 102B is also coupled to the intermediate node 101 of the attenuator.

In alternative embodiments, the bipolar transistors 102A, 102B could be replaced by MOS transistors, such that they form common drain amplifiers rather than common collector amplifiers. Furthermore, in some embodiments, the variable current sources 104A, 104B could be implemented by other types of devices, such as bipolar transistors.

The circuits 100A, 100B of FIG. 1 for example further comprise other elements adapted to improve the circuit characteristics at high frequencies.

For example, the circuit 100A comprises a waveguide 106A connected between the collector of the bipolar transistor 102A and a supply voltage rail $V_{cc}$. A capacitor 108A is for example connected between the supply voltage rail $V_{cc}$ and ground for RF and DC decoupling. Furthermore, the base of the transistor 102A is for example connected to a supply voltage rail $V_{bb}$ via a resistor 110A, and to one node of a capacitor 112A. The capacitor 112A for example provides low frequency isolation of the base of the transistor 102A from the input RF signal as well as RF and DC decoupling, and for example has a capacitance in a range 30 to 150 fF, for example approximately 50 fF. The other node of capacitor 112A is for example connected via a waveguide 114A and a further waveguide 116A to the input node 103. A ground stub, in the form of a further waveguide 120A, for example connects an intermediate node 122A between the waveguides 114A and 116A to ground. The emitter of transistor 102A is for example connected to the intermediate node 101 via the series connection of a capacitor 126A and a waveguide 128A. The capacitor 126A for example has a capacitance in the range 50 to 150 fF, and for example of approximately 50 fF.

Similarly, the circuit 100B for example comprises a waveguide 106B connected between the collector of the bipolar transistor 102B and a supply voltage rail $V_{cc}$. A capacitor 108B is for example connected between the supply voltage rail $V_{cc}$ and ground. Furthermore, the base of the transistor 102B is for example connected to a supply voltage rail $V_{bb}$ via a resistor 110B, and to one node of a capacitor 112B. The capacitor 112B for example has a capacitance equal to that of the capacitor 112A. The other node of capacitor 112B is for example connected via a waveguide 114B and a further waveguide 116B to the output node 105. A ground stub, in the form of a further waveguide 120B, for example connects an intermediate node 122B between the waveguides 114B and 116B to ground. The emitter of transistor 102B is for example connected to the intermediate node 101 via the series connection of a capacitor 126B and a waveguide 128B. The capacitor 126B for example has the same capacitance as capacitor 126A.

The intermediate node 101 between the two circuits 101A, 101B is for example connected to ground via a further waveguide 132.

A control block (CTRL) 134 for example generates the biasing voltage $V_{BIAS}$ provided to the gates of transistors 104A, 104B based on a control signal G indicating a desired attenuation of the attenuator. In some embodiments, the value of the control signal G is a digital value programmed by a user. In other embodiments, the control signal G is for example a voltage signal, and could be generated by other circuits not represented in FIG. 1, for example in the case that the attenuation is automatically adapted based on a feedback loop.

The present inventors have found that, by providing an attenuator having circuit portions each comprising an amplifier connected in a symmetrical fashion with respect to an intermediate node, the attenuation provided by the attenuator can be relatively constant over a large frequency bandwidth of over 20 GHz, and for example for a frequency bandwidth of up to 40 GHz or more. For example, the inventors have found that the circuit of FIG. 1 is able to provide a relatively uniform attenuation at approximately −6 dB over the frequency band of 135 to 175 GHz. Furthermore, the input and output impedances of the attenuator can be precisely controlled, and well matched with each other.

An application of the attenuator 100 of FIG. 1 in a test system for a device under test will now be described with reference to FIGS. 2 and 3.

Figure 2:
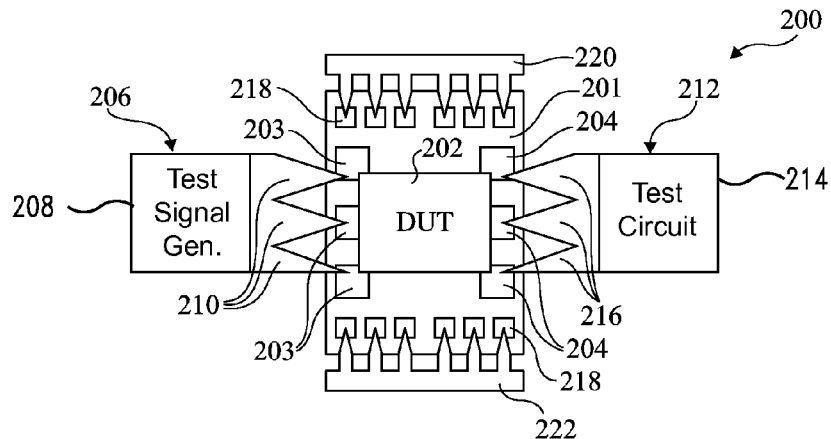
FIG. 2 schematically illustrates a test system according to an embodiment of the present disclosure.

FIG. 2 illustrates a test system 200 comprising an integrated circuit 201 comprising a device under test (DUT) 202. The DUT 202 for example has connection pads, there being six in the example of FIG. 2, three of which are input RF pads 203, and three of which are output RF pads 204.

The three input pads 203 are connected to a probe 206 via which input power is applied to the DUT in the form of one or more test signals. The probe 206 for example comprises output pins 210 for contacting the pads 203, and a circuit 208 for generating the test signals applied to the pads 203 via the output pins 210.

A further probe 212 is for example in contact with the three output pads 204 of the DUT 202, and comprises pins 216 for respectively contacting the three pads 204, and a test circuit 214 providing attenuation and detection. The test circuit 214 is for example adapted to measure parameters of the DUT, such as noise figure, optimum power, etc. The test circuit 214 is for example implemented by an integrated circuit positioned in the probe 212, the pins 216 forming input pins of the integrated circuit. Thus, whereas prior art solutions generally connect the test circuit to the probe via a cable that can be tens of centimeters long, in the system 200, the test circuit 214 is advantageously integrated within the probe. The output pads 204 of the DUT and the test circuit 214 can therefore be separated by a relatively short distance, for example in the order of several millimeters.

Figure 3:
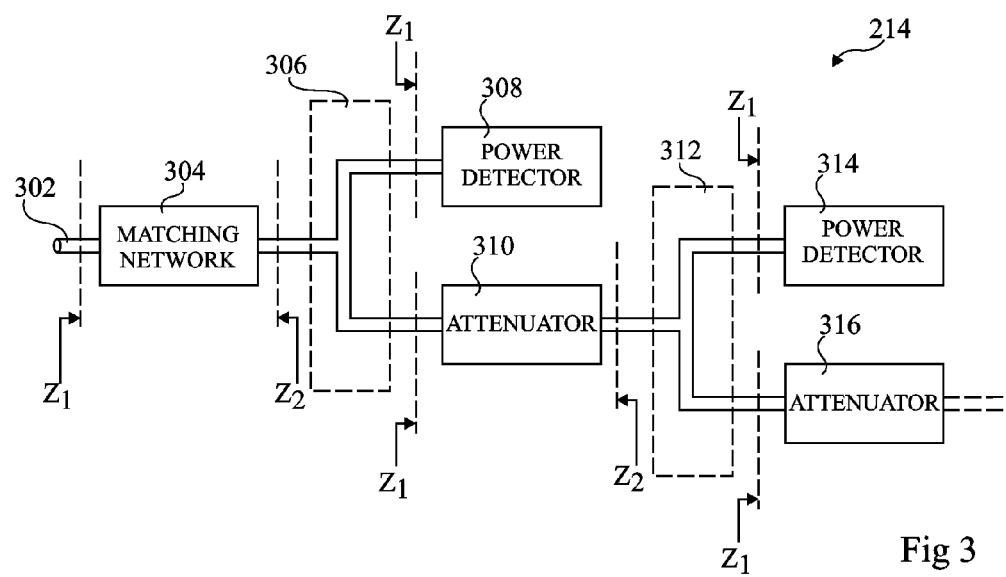
FIG. 3 schematically illustrates a detection and attenuation circuit of the test system of FIG. 2 in more detail according to an example embodiment.

FIG. 3 schematically illustrates the test circuit 214 of FIG. 2 in more detail according to an example embodiment. As indicated above, this circuit is for example implemented by an integrated circuit.

The circuit 214 for example comprises an input 302 connected to one of the pins 216 of the probe 212 (not illustrated in FIG. 3). In the test circuit 214, the input 302 is for example connected to the input of a matching network 304, which for example has an input impedance of $Z_1$, for example of approximately 50 ohms. The output impedance of the matching network 304 is for example equal to an impedance $Z_2$, which may be the same as or different from the impedance $Z_1$. In some embodiments, the output impedance $Z_2$ is equal to approximately 25 ohms.

The output of matching network 304 is connected to a power splitter 306, which splits the signal into two parts, for example of approximately equal power. One of the outputs of the splitter 306 is connected to a power detector 308, which detects the power of the signal. The other output of the splitter 306 is for example provided to an attenuator 310, which is for example implemented by the circuit 100 of FIG. 1. The input impedance of both the power detector 308 and of the attenuator 310 are for example chosen to be equal to the impedance $Z_1$, and the output impedance of attenuator 310 is for example chosen to be equal to the impedance $Z_2$. For example, in the case that the input and output impedances of the attenuator are different from each other, the attenuator may comprise, in addition to the circuit of FIG. 1, a matching network at its output to bring the output impedance to the appropriate value.

FIG. 3 also illustrates a subsequent stage of power detection and attenuation, comprising a further splitter 312, a further power detector 314, and a further attenuator 316. These elements are for example the same as the elements 304, 308 and 310 respectively, and will not be described in detail. By providing several stages of attenuation and power detection, the circuit 214 is capable of detecting the power of the output signal of the DUT at various levels of attenuation, and thus for a broad range of the input power levels of the DUT.

An advantage of the attenuator described herein is that it is capable of providing a relatively low level of attenuation, for example as low as −6 dB. Furthermore, it is capable of providing a variable level of attenuation, by adjustment of the control value G. Furthermore, the attenuator is capable of operating over a relatively broad bandwidth, for example of 20 GHz or more.

Having thus described at least one illustrative embodiment, various alterations, modifications and improvements will readily occur to those skilled in the art.

For example, it will be apparent to those skilled in the art that the particular circuitry illustrated in FIG. 1 provides just one example implementation, and that different arrangements of waveguides, resistors and capacitors would be possible, and one or more of these components could be omitted, depending on the particular application.

Furthermore, it will be apparent that while a control circuit 134 is provided allowing the attenuation of the attenuator of FIG. 1 to be controlled, in some embodiments this control circuit could be omitted, the attenuator being adapted to provide a relatively constant attenuation. Furthermore, the variable current sources 104A, 104B could be replaced by elements of fixed impedance, such as by resistors or waveguides.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An attenuator comprising:
   an input;
   an intermediate node;
   an output;
   a first common collector or common drain amplifier including a first transistor having a control node electrically coupled to the input of the attenuator and an emitter or a source electrically coupled to the intermediate node of the attenuator;
   a second common collector or common drain amplifier including a second transistor having an emitter or a source electrically coupled to the intermediate node and a control node electrically coupled to the output of the attenuator;
   a first current source transistor electrically coupled to the emitter or source of the first transistor and having a control node configured to receive a biasing voltage; and
   a second current source transistor electrically coupled to the emitter or source of the second transistor and having a control node configured to receive the biasing voltage.

2. The attenuator of claim 1, wherein the first and second current source transistors are variable current sources.

3. The attenuator of claim 1, further comprising a control circuit configured to generate the biasing voltage based on a control signal.

4. The attenuator of claim 1, further comprising:
   a first capacitor;
   a first waveguide series connected to the first capacitor;
   a second capacitor; and
   a second waveguide series connected to the second capacitor, wherein the control node of the first transistor is coupled to the input node of the attenuator via the first capacitor and the first waveguide and the control node of the second transistor is coupled to the output node of the attenuator via the second capacitor and the second waveguide.

5. The attenuator of claim 1, further comprising:
   a third capacitor;
   a third waveguide series connected to the third capacitor;
   a fourth capacitor; and
   a fourth waveguide series connected to the fourth capacitor, wherein the emitter or source of the first transistor is coupled to the intermediate node via the third capacitor and the third waveguide series and the emitter or source of the second transistor is coupled to the intermediate node via the fourth capacitor and the fourth waveguide series.

6. A probe comprising:
   an input pin configured to be connected to an output pad of a device under test; and
   an attenuator that includes:
   an input coupled to the input pin;
   an intermediate node;
   an output;
   a first common collector or common drain amplifier including a first transistor having a control node electrically coupled to the input of the attenuator and an emitter or a source electrically coupled to the intermediate node of the attenuator;
   a second common collector or common drain amplifier including a second transistor having an emitter or a source electrically coupled to the intermediate node and a control node electrically coupled to the output of the attenuator;
   a first current source transistor electrically coupled to the emitter or source of the first transistor and having a control node configured to receive a biasing voltage; and
   a second current source transistor electrically coupled to the emitter or source of the second transistor and having a control node configured to receive the biasing voltage.

7. The probe of claim 6, further comprising a matching network coupling the attenuator to the input pin.

8. The probe of claim 6 further comprising:
   a splitter;
   a first power detector, wherein the attenuator and first power detector are both coupled to the input pin via the splitter; and a second power detector coupled to the output of the attenuator.

9. The probe of claim 6, wherein the first and second current source transistors are variable current sources.

10. The probe of claim 6, wherein the attenuator includes a control circuit configured to generate the biasing voltage based on a control signal.

11. The probe of claim 6, wherein the attenuator includes:
a first capacitor;
a first waveguide series connected to the first capacitor;
a second capacitor; and
a second waveguide series connected to the second capacitor, wherein the control node of the first transistor is coupled to the input node of the attenuator via the first capacitor and the first waveguide and the control node of the second transistor is coupled to the output node of the attenuator via the second capacitor and the second waveguide.

12. The probe of claim 6, wherein the attenuator includes:
a third capacitor;
a third waveguide series connected to the third capacitor;
a fourth capacitor; and
a fourth waveguide series connected to the fourth capacitor, wherein the emitter or source of the first transistor is coupled to the intermediate node via the third capacitor and the third waveguide series and the emitter or source of the second transistor is coupled to the intermediate node via the fourth capacitor and the fourth waveguide series.

13. An attenuator comprising:
an input node;
an intermediate node;
an output node;
a first capacitor having a first side coupled to the input node via a first waveguide series;
a first common collector or common drain amplifier including a first transistor having a control node electrically coupled to a second side of the first capacitor and an emitter or a source electrically coupled to the intermediate node of the attenuator; and
a second common collector or common drain amplifier including a second transistor having an emitter or a source electrically coupled to the intermediate node and a control node electrically coupled to the output node of the attenuator.

14. The attenuator of claim 13, further comprising:
a second capacitor; and
a second waveguide series connected to the second capacitor in series, wherein the control node of the second transistor is coupled to the output node of the attenuator via the second capacitor and the second waveguide series connected in series.

15. The attenuator of claim 13, further comprising:
a third capacitor;
a third waveguide series connected to the third capacitor;
a fourth capacitor; and
a fourth waveguide series connected to the fourth capacitor, wherein the emitter or source of the first transistor is coupled to the intermediate node via the third capacitor and the third waveguide series and the emitter or source of the second transistor is coupled to the intermediate node via the fourth capacitor and the fourth waveguide series.

16. A probe comprising:
an input pin configured to be connected to an output pad of a device under test; and
an attenuator that includes:
an input node coupled to the input pin;
an intermediate node;
an output node;
a first capacitor having a first side coupled to the input node via a first waveguide series;
a first common collector or common drain amplifier including a first transistor having a control node electrically coupled to a second side of the first capacitor and an emitter or a source electrically coupled to the intermediate node of the attenuator; and
a second common collector or common drain amplifier including a second transistor having an emitter or a source electrically coupled to the intermediate node and a control node electrically coupled to the output node of the attenuator.

17. The probe of claim 16, wherein the attenuator includes:
a second capacitor; and
a second waveguide series connected to the second capacitor in series, wherein the control node of the second transistor is coupled to the output node of the attenuator via the second capacitor and the second waveguide series connected in series.

18. The probe of claim 16, wherein the attenuator includes:
a third capacitor;
a third waveguide series connected to the third capacitor;
a fourth capacitor; and
a fourth waveguide series connected to the fourth capacitor, wherein the emitter or source of the first transistor is coupled to the intermediate node via the third capacitor and the third waveguide series and the emitter or source of the second transistor is coupled to the intermediate node via the fourth capacitor and the fourth waveguide series.

19. An attenuator comprising:
an input node;
an intermediate node;
an output node;
a first capacitor and a first waveguide series that are connected in series;
a first common collector or common drain amplifier including a first transistor having a control node electrically coupled to the input of the attenuator and an emitter or a source electrically coupled to the intermediate node of the attenuator via the first capacitor and the first waveguide series that are connected in series; and
a second common collector or common drain amplifier including a second transistor having an emitter or a source electrically coupled to the intermediate node and a control node electrically coupled to the output of the attenuator.

20. The attenuator of claim 19, further comprising:
a second capacitor and a second waveguide series that are connected in series, wherein the emitter or source of the second transistor is coupled to the intermediate node via the second capacitor and the second waveguide series that are connected in series.

21. A probe comprising:
an input pin configured to be connected to an output pad of a device under test; and
an attenuator that includes:
an input node coupled to the input pin;
an intermediate node;
an output node;

a first capacitor and a first waveguide series that are connected in series;

a first common collector or common drain amplifier including a first transistor having a control node electrically coupled to the input of the attenuator and an emitter or a source electrically coupled to the intermediate node of the attenuator via the first capacitor and the first waveguide series that are connected in series; and a second common collector or common drain amplifier including a second transistor having an emitter or a source electrically coupled to the intermediate node and a control node electrically coupled to the output of the attenuator.

22. The probe of claim 21, wherein the attenuator includes:

a second capacitor and a second waveguide series that are connected in series, wherein the emitter or source of the second transistor is coupled to the intermediate node via the second capacitor and the second waveguide series that are connected in series.

* * * * *